(12) United States Patent
Ohashi et al.

(10) Patent No.: US 9,534,140 B2
(45) Date of Patent: Jan. 3, 2017

(54) RESIST UNDERLAYER FILM-FORMING COMPOSITION

(71) Applicant: NISSAN CHEMICAL INDUSTRIES, LTD., Tokyo (JP)

(72) Inventors: Tomoya Ohashi, Toyama (JP); Shigeo Kimura, Toyama (JP); Hiroto Ogata, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/655,797

(22) PCT Filed: Dec. 17, 2013

(86) PCT No.: PCT/JP2013/083752
§ 371 (c)(1),
(2) Date: Jun. 26, 2015

(87) PCT Pub. No.: WO2014/109186
PCT Pub. Date: Jul. 17, 2014

(65) Prior Publication Data
US 2015/0337164 A1    Nov. 26, 2015

(30) Foreign Application Priority Data

Jan. 9, 2013  (JP) .................................. 2013-001857

(51) Int. Cl.
| | |
|---|---|
| C09D 167/04 | (2006.01) |
| G03F 7/11 | (2006.01) |
| G03F 7/09 | (2006.01) |
| C08G 63/06 | (2006.01) |
| C08J 3/09 | (2006.01) |
| C08K 3/00 | (2006.01) |
| C08K 5/00 | (2006.01) |

(52) U.S. Cl.
CPC ............ C09D 167/04 (2013.01); C08G 63/065 (2013.01); C08J 3/095 (2013.01); G03F 7/091 (2013.01); G03F 7/094 (2013.01); G03F 7/11 (2013.01); *C08J 2367/04* (2013.01); *C08K 3/0008* (2013.01); *C08K 5/0008* (2013.01)

(58) Field of Classification Search
CPC .................................................. C09D 167/04
See application file for complete search history.

(56) References Cited

U.S. PATENT DOCUMENTS

2010/0120967 A1* 5/2010 Kinoshita ............ C08G 63/187
524/493

FOREIGN PATENT DOCUMENTS

| JP | 2004-189925 A | 7/2004 |
| JP | 2004-212907 A | 7/2004 |
| JP | 2004-217774 A | 8/2004 |
| JP | 2010-181453 A | 8/2010 |
| WO | 2009/057458 A1 | 5/2009 |
| WO | 2011/074494 A1 | 6/2011 |

OTHER PUBLICATIONS

Jan. 21, 2014 International Search Report issued in International Patent Application No. PCT/JP2013/083752.
Jan. 21, 2014 Written Opinion of the International Searching Authority issued in International Patent Application No. PCT/JP2013/083752.

* cited by examiner

*Primary Examiner* — Megan McCulley
(74) *Attorney, Agent, or Firm* — Oliff PLC

(57) ABSTRACT

There is provided a resist underlayer film-forming composition having excellent solubility in a solvent containing propylene glycol monomethyl ether as a main component. A resist underlayer film-forming composition comprising a polymer having a structural unit of Formula (1a) or Formula (1c) and a structural unit of Formula (1b) and a solvent containing more than 50% by mass of propylene glycol monomethyl ether, wherein in the polymer, the structural unit of Formula (1a) or Formula (1c) and the structural unit of Formula (1b) are arranged alternately.

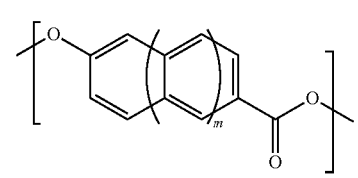

(1a)

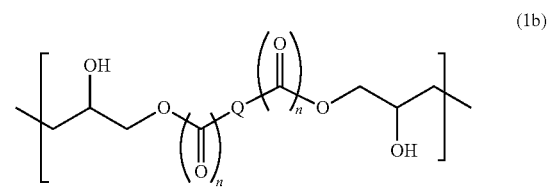

(1b)

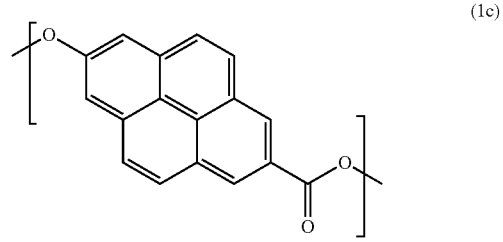

(1c)

(In Formulae (1a) and (1b), Q is a phenylene group or a naphthylene group, m is 1 or 2, and each of n is independently 0 or 1).

6 Claims, No Drawings

RESIST UNDERLAYER FILM-FORMING COMPOSITION

TECHNICAL FIELD

The present invention relates to a resist underlayer film-forming composition having excellent solubility in a solvent containing propylene glycol monomethyl ether as a main component.

BACKGROUND ART

A lithography process in production of a semiconductor device usually includes a process of applying a solution. Examples of the solution used in the application process may include a resist underlayer film-forming composition as a solution and a resist-forming composition as a solution, in which a polymer and an additive or the like are dissolved in an organic solvent. In recent years, use of a solvent that has low harmfulness to the human body and high safety in the lithography process has been increasingly required. For this reason, use of an organic solvent conventionally used may be avoided, and a usable organic solvent tends to be limited.

For example, N-methyl-2-pyrrolidone and cyclohexanone are known to have high skin permeability, and it is suspected to adversely affect the fetus. Further, cyclohexanone is suspected to be carcinogenic.

When the usable organic solvent is limited, a polymer having high solubility in the limited organic solvent should be selected. Otherwise, a homogeneous solution cannot be prepared, and it is difficult to form a homogeneous film.

Examples of documents about a solution used in the lithography process may include Patent Documents 1 and 2. Patent Document 1 describes an anti-reflective coating-forming composition containing a reaction product of a compound having at least two glycidyl ether structures with an aromatic compound such as hydroxybenzoic acid and naphthalenecarboxylic acid. Patent Document 1 describes that in a synthesis example, an oligomer compound is obtained from a compound having 4 or more glycidyl ether structures and a compound having a hydroxy group and/or a carboxyl group, such as 4-hydroxybenzoic acid. One of the solvents that can be used in the present invention described in Patent Document 1 is propylene glycol monomethyl ether. Patent Document 2 describes a resist underlayer film-forming composition for lithography which contains a solvent and a polymer having a structure obtained by introducing 2,4-dihydroxybenzoic acid through an ester bond and an ether bond. One of the solvents that can be used in the present invention described in Patent Document 2 is propylene glycol monomethyl ether.

PRIOR ART DOCUMENTS

Patent Documents

Patent Document 1: Japanese Patent Application Publication No. 2004-212907 (JP 2004-212907 A)
Patent Document 2: WO2009-057458 Pamphlet

SUMMARY OF THE INVENTION

Problem to be Solved by the Invention

An object of the present invention is to provide a resist underlayer film-forming composition containing a polymer having excellent solubility in a solvent containing propylene glycol monomethyl ether, which is considered that harmfulness to the human body is low and safety is high, as a main component.

Means for Solving the Problem

A first aspect of the present invention is a resist underlayer film-forming composition comprising a polymer having a structural unit of Formula (1a) or Formula (1c) and a structural unit of Formula (1b), and a solvent containing more than 50% by mass of propylene glycol monomethyl ether, wherein in the polymer, the structural unit of Formula (1a) or Formula (1c) and the structural unit of Formula (1b) are arranged alternately.

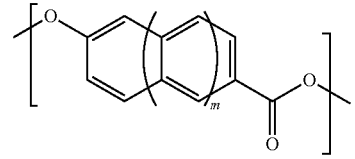

(1a)

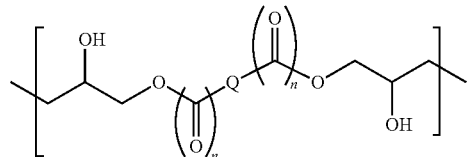

(1b)

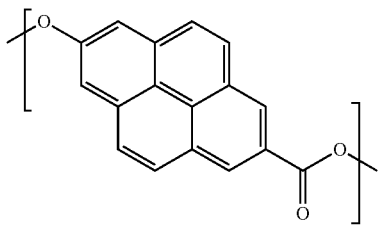

(1c)

(In Formulae (1a) and (1b), Q is a phenylene group or a naphthylene group, m is 1 or 2, and each of n is independently 0 or 1.)

A second aspect of the present invention is a resist underlayer film-forming composition comprising a polymer having a structural unit of Formula (1a'), and a structural unit of Formula (1b') and a structural unit of Formula (1b"), and a solvent containing more than 50% by mass of propylene glycol monomethyl ether, wherein in the polymer, the structural unit of Formula (1a') and the structural unit of Formula (1b'), and the structural unit of Formula (1a') and the structural unit of Formula (1b") are arranged alternately.

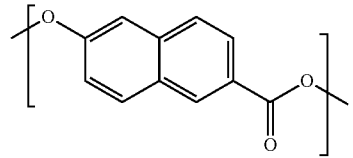

(1a')

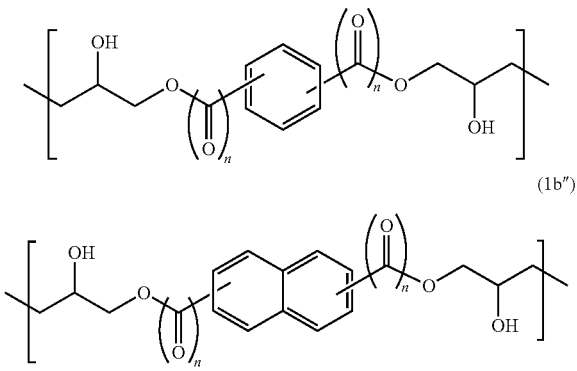

(In Formulae (1b') and (1b"), each of n is independently 0 or 1.)

When the content of propylene glycol monomethyl ether in the solvent is less than 100% by mass, a residual component of the solvent is a solvent miscible in propylene glycol monomethyl ether without layer separation.

The resist underlayer film-forming composition may further contain a crosslinkable compound (crosslinker), and may additionally contain a crosslinking catalyst in addition to the crosslinker.

The resist underlayer film-forming composition may further contain a surfactant.

A method for forming a resist pattern using the resist underlayer film-forming composition of the present invention includes the steps of applying the composition to a semiconductor substrate, followed by baking, to form a resist underlayer film, applying a resist solution to the resist underlayer film, followed by baking, to form a resist, exposing the semiconductor substrate coated with the resist underlayer film and the resist to light, followed by performing post exposure bake if necessary, and developing the resist, followed by rinsing.

Effects of the Invention

Since the resist underlayer film-forming composition of the present invention contains a solvent containing more than 50% by mass of propylene glycol monomethyl ether and a polymer having high solubility in the solvent, harmfulness to the human body is low, and safety is high. Further, by using the composition, a homogeneous resist underlayer film can be formed.

MODES FOR CARRYING OUT THE INVENTION

A polymer contained in the resist underlayer film-forming composition of the present invention has an aromatic ring having absorptivity for KrF excimer laser, ArF excimer laser, or extreme ultraviolet light (EUV) used in a lithography process. Herein, examples of the aromatic ring may include a benzene ring, a naphthalene ring, an anthracene ring, and a pyrene ring. A polymer having a benzene ring is a polymer having a structural unit of Formula (1b'). A polymer having a naphthalene ring is a polymer having a structural unit of Formula (1a'), in which m is 1 in Formula (1a), and/or a structural unit of Formula (1b"). A polymer having an anthracene ring is a polymer having a structural unit of Formula (1a), in which m is 2. A polymer having a pyrene ring is a polymer having a structural unit of Formula (1c).

The weight-average molecular weight of the polymer is, for example, 1,000 to 100,000, and preferably 2,000 to 10,000. When the weight-average molecular weight of the polymer is less than 1,000, the resistance of a film to be formed to a resist solvent may be insufficient. The weight-average molecular weight is a value determined by gel permeation chromatography (GPC) using polystyrene as a standard sample.

The resist underlayer film-forming composition of the present invention may contain a crosslinkable compound (crosslinker). As the crosslinkable compound, a compound having at least two crosslink-forming substituents is preferably used. Examples thereof may include a melamine-based compound having a crosslink-forming substituent such as a methylol group and a methoxymethyl group, a substituted urea-based compound or aromatic compound, a monomer or polymer compound having an epoxy group, a blocked isocyanate compound. A more preferable crosslinkable compound is a nitrogen-containing compound that has 2 to 4 nitrogen atoms and is substituted with a methylol group or an alkoxymethyl group. Examples of the nitrogen-containing compound may include hexamethoxy methyl melamine, tetramethoxymethyl benzoguanamine, 1,3,4,6-tetrakis (methoxymethyl)glycoluril, 1,3,4,6-tetrakis(butoxymethyl) glycoluril, 1,3,4,6-tetrakis(hydroxymethyl)glycoluril, 1,3-bis(hydroxymethyl)urea, 1,1,3,3-tetrakis(butoxymethyl) urea, and 1,1,3,3-tetrakis(methoxymethyl)urea. In addition, examples of the aromatic compound substituted with a methylol group or a methoxymethyl group may include 1-hydroxybenzene-2,4,6-trimethanol, 3,3',5,5'-tetrakis(hydroxymethyl)-4,4'-dihydroxybiphenyl (trade name: TML-BP, manufactured by Honshu Chemical Industry Co., Ltd.), 5,5'-[2,2,2-trifluoro-1-(trifluoromethyl)ethylidene]bis[2-hydroxy-1,3-benzenedimethanol] (trade name: TML-BPAF-MF, manufactured by Honshu Chemical Industry Co., Ltd.), 2,2-dimethoxymethyl-4-tert-butylphenol (trade name: DMOM-PTBP, manufactured by Honshu Chemical Industry Co., Ltd.), 3,3',5,5'-tetramethoxymethyl-4,4'-dihydroxybiphenyl (trade name: TMOM-BP, manufactured by Honshu Chemical Industry Co., Ltd.), bis(2-hydroxy-3-hydroxymethyl-5-methylphenyl)methane (trade name: DM-BIPC-F, manufactured by Asahi Organic Chemicals Industry Co., Ltd.), bis(4-hydroxy-3-hydroxymethyl-5-methylphenyl) methane (trade name: DM-BIOC-F, manufactured by Asahi Organic Chemicals Industry Co., Ltd.), and 5,5'-(1-methylethylidene)bis(2-hydroxy-1,3-benzenedimethanol) (trade name: TM-BIP-A, manufactured by Asahi Organic Chemicals Industry Co., Ltd.). These compounds may be used singly or two or more of them may be used in combination.

The content of the crosslinkable compound is, for example, 1 to 80% by mass, and preferably 10 to 60% by mass, relative to the content of the polymer. When the content of the crosslinkable compound is too small or too large, the resistance of a film to be formed to a resist solvent may be insufficiently achieved.

In order to promote a crosslinking reaction, the resist underlayer film-forming composition of the present invention may contain a crosslinking catalyst in addition to the crosslinkable compound. As the crosslinking catalyst, a sulfonic acid compound or a carboxylic acid compound, or a thermal acid generator can be used. Examples of the sulfonic acid compound or the carboxylic acid compound may include p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. Examples of the thermal acid generator may include K-PURE [registered trademark] CXC-1612, CXC-1614, TAG-2172, TAG-2179, TAG-2678, and TAG2689 (manufactured by King Industries, Inc.), and SI-45, SI-60, SI-80, SI-100, SI-110, and SI-150 (manufactured by SANSHIN CHEMICAL INDUSTRY CO., LTD.). These crosslinking catalysts may be used singly or two or more of them may be used in combination. The content of the crosslinking catalyst is, for example, 1 to 20% by mass, and preferably 1 to 12% by mass, relative to the content of the crosslinker.

The resist underlayer film-forming composition of the present invention may contain a surfactant as an optional component to improve application properties to a substrate. Examples of the surfactant may include a nonionic surfactant including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, a fluorosurfactant such as EFTOP [registered trademark] EF301, EF303, and EF352 (manufactured by Mitsubishi Materials Electronic Chemicals Co., Ltd.), MEGAFAC [registered trademark] F171, F173, R-30, R-30N, and R-40 (manufactured by DIC Corporation), Fluorad FC-430 and FC431 (manufactured by Sumitomo 3M, Ltd.), Asahi Guard [registered trademark] AG710, and Surflon S-382, SC101, SC102, SC103, SC104, SC105, and SC106 (manufactured by Asahi Glass Co., Ltd.), and organosiloxane polymer KP341 (manufactured by Shin-Etsu Chemical Co., Ltd.). These surfactants may be used singly or two or more of them may be used in combination. When the surfactant described above is used, the content of the surfactant is, for example, 0.01 to 5% by mass, and preferably 0.1 to 3% by mass, relative to the content of the polymer.

The resist underlayer film-forming composition of the present invention can be prepared by dissolving the components in a solvent containing more than 50% by mass, for example, 70% by mass or more and 100% by mass or less of propylene glycol monomethyl ether. The resist underlayer film-forming composition can be used in a homogeneous solution state. When the content of propylene glycol monomethyl ether in the solvent is less than 100% by mass, a residual component of the solvent is a solvent miscible in propylene glycol monomethyl ether without layer separation. Examples of such a solvent may include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether acetate, propylene glycol propyl ether acetate, toluene, xylene, methyl ethyl ketone, methyl isobutyl ketone, cyclopentanone, 4-methyl-2-pentanol, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethyl formamide, N,N-dimethyl acetamide, and water. Preferred examples are diethylene glycol monoethyl ether, propylene glycol, propylene glycol monoethyl ether, propylene glycol monomethyl ether acetate, xylene, methyl ethyl ketone, methyl isobutyl ketone, cyclopentanone, 4-methyl-2-pentanol, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and water. These solvents may be used singly or two or more of them may be used in combination.

It is preferable that the prepared resist underlayer film-forming composition be used after filtration through a filter with a pore diameter of 0.2 μm, for example. The resist underlayer film-forming composition of the present invention has excellent storage stability at room temperature for a long period of time.

Hereinafter, use of the resist underlayer film-forming composition of the present invention will be described. The resist underlayer film-forming composition of the present invention is applied to a substrate [e.g., a semiconductor substrate such as a silicon wafer, a semiconductor substrate such as a silicon wafer coated with a silicon oxide film, a semiconductor substrate such as a silicon wafer coated with a silicon nitride film or a silicon nitride oxide film, a silicon nitride substrate, a quartz substrate, a glass substrate (including alkali-free glass, low alkaline glass, and crystalline glass), and a glass substrate with an ITO film] by an appropriate applying procedure using a spinner, a coater, or the like, and then baked by a heating means such as a hot plate to form a resist underlayer film. A baking condition is appropriately selected from a baking temperature of 100° C. to 400° C. and a baking time of 0.3 minutes to 10 minutes. It is preferable that the baking temperature be 120° C. to 300° C. and the baking time be 0.5 minutes to 5 minutes. For example, the resist underlayer film to be formed has a thickness of 0.001 μm to 1 μm, preferably 0.002 μm to 0.5 μm, and more preferably 0.002 μm to 0.1 μm.

When the temperature during baking is lower than the above-described range, crosslinking is insufficient, which may cause intermixing between the resist underlayer film and a resist to be formed on the upper layer of the film. In contrast, when the temperature during baking is higher than the above-described range, the resist underlayer film may be thermally decomposed.

Subsequently, a resist is formed on the resist underlayer film. The resist can be formed by a general method, that is, by applying a photoresist solution to the resist underlayer film, followed by baking.

A photoresist solution used to form the resist is not particularly limited as long as it is exposed to light used for exposure, and a positive photoresist can be used. Examples thereof may include a chemically amplified photoresist including a binder having a group that increases an alkali dissolution rate by decomposition with an acid and a photoacid generator, a chemically amplified photoresist including a low molecular compound that increases an alkali dissolution rate of a photoresist by decomposition with an acid, an alkali-soluble binder, and a photoacid generator, and a chemically amplified photoresist including a binder having a group that increases an alkali dissolution rate by decomposition with an acid, a low molecular compound that increases the alkali dissolution rate of the photoresist by decomposition with the acid, and a photoacid generator. Specific examples thereof may include photoresist solutions with trade name: PAR710 manufactured by Sumitomo Chemical Co., Ltd., trade name: TDUR-P3435LP manufactured by TOKYO OHKA KOGYO CO., LTD., and trade name: SEPR430 manufactured by Shin-Etsu Chemical Co., Ltd. A negative photoresist can be also used instead of the positive photoresist.

In order to form a resist pattern, exposure through a mask (reticle) for formation of a predetermined pattern is carried out. For example, a KrF excimer laser, an ArF excimer laser, or extreme ultraviolet light (EUV) can be used for exposure. After exposure, post exposure bake is carried out, if necessary. A condition of "post exposure bake is appropriately selected from a baking temperature of 80° C. to 150° C. and a baking time of 0.3 minutes to 10 minutes. Then, a resist pattern is formed through a step of development with an alkaline developer. A development condition is appropriately selected from a development temperature of 5° C. to 50° C. and a development time of 10 seconds to 300 seconds.

Examples of the alkaline developer may include an alkaline aqueous solution including an aqueous solution of an alkali metal hydroxide such as potassium hydroxide and sodium hydroxide, an aqueous solution of quaternary ammonium hydroxide such as tetramethylammonium hydroxide, tetraethylammonium hydroxide, and choline; and an aqueous solution of amine such as ethanolamine, propylamine, and ethylenediamine. Further, a surfactant or the like can be added to the developer.

EXAMPLES

Hereinafter, specific examples of the resist underlayer film-forming composition of the present invention will be described using the following Synthesis Examples and Examples. However, the present invention is not limited to these Examples.

Devices used in measurement of weight-average molecular weights of polymers obtained in the following Synthesis Examples are as follows.
Device: HLC-8320GPC manufactured by TOSOH CORPORATION
GPC column: Shodex [registered trademark] Asahipak [registered trademark] (Showa Denko K.K.)
Column temperature: 40° C.
Solvent: N,N-dimethyl formamide (DMF)
Flow rate: 0.6 mL/min
Standard sample: polystyrene (TOSOH CORPORATION)

Synthesis Example 1

A mixed solution of 27 g of diglycidyl terephthalate (trade name EX-711, manufactured by Nagase ChemteX Corporation), 18.492 g of 6-hydroxy-2-naphthoic acid (manufactured by Tokyo Chemical Industry Co., Ltd.), 1.824 g of ethyl triphenylphosphonium bromide (manufactured by Acros Organics), and 110.404 g of propylene glycol monomethyl ether was heated to 120° C. and reacted under a nitrogen atmosphere for 24 hours, to obtain a solution of macromolecular compound having a structural unit of Formula (A-1). The obtained macromolecular compound was analyzed by GPC. The weight-average molecular weight in terms of standard polystyrene was about 3,900.

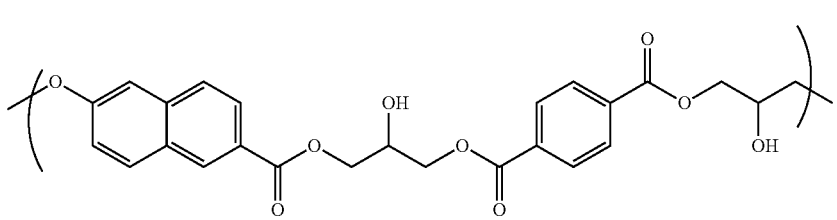

(A-1)

Synthesis Example 2

A mixed solution of 7.00 g of diglycidyl terephthalate (trade name EX-711, manufactured by Nagase ChemteX Corporation), 4.97 g of 6-hydroxy-2-naphthoic acid (manufactured by Tokyo Chemical Industry Co., Ltd.), 0.45 g of ethyl triphenylphosphonium bromide (manufactured by Acros Organics), and 28.96 g of propylene glycol monomethyl ether was heated to 120° C. and reacted under a nitrogen atmosphere for 24 hours, to obtain a solution of macromolecular compound having a structural unit of Formula (A-1). The obtained macromolecular compound was analyzed by GPC. The weight-average molecular weight in terms of standard polystyrene was about 3,900.

Synthesis Example 3

A mixed solution of 5.0 g of 1,6-bis(2,3-epoxypropan-1-yloxy)naphthalene (trade name HP-4032D, manufactured by DIC Corporation), 4.943 g of diglycidyl terephthalate (trade name EX-711, manufactured by Nagase ChemteX Corporation), 6.771 g of 6-hydroxy-2-naphthoic acid (manufactured by Tokyo Chemical Industry Co., Ltd.), 0.668 g of ethyl triphenylphosphonium bromide (manufactured by Acros Organics), and 40.557 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 6,100.

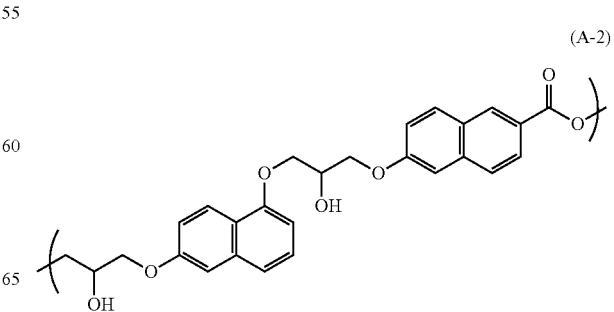

(A-2)

-continued

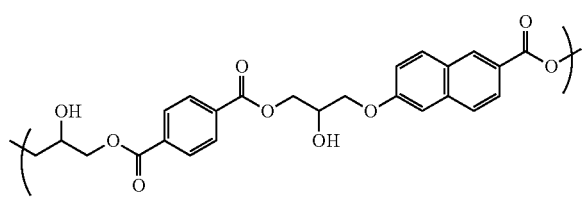

(A-3)

Synthesis Example 4

A mixed solution of 5.0 g of 1,6-bis(2,3-epoxypropan-1-yloxy)naphthalene (trade name HP-4032D, manufactured by DIC Corporation), 4.943 g of diglycidyl terephthalate (trade name EX-711, manufactured by Nagase ChemteX Corporation), 7.109 g of 6-hydroxy-2-naphthoic acid (manufactured by Tokyo Chemical Industry Co., Ltd.), 0.668 g of ethyl triphenylphosphonium bromide (manufactured by Acros Organics), and 41.347 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 5,900.

Synthesis Example 5

A mixed solution of 5.0 g of 1,6-bis(2,3-epoxypropan-1-yloxy)naphthalene (trade name HP-4032D, manufactured by DIC Corporation), 4.943 g of diglycidyl terephthalate (trade name EX-711, manufactured by Nagase ChemteX Corporation), 6.432 g of 6-hydroxy-2-naphthoic acid (manufactured by Tokyo Chemical Industry Co., Ltd.), 0.668 g of ethyl triphenylphosphonium bromide (manufactured by Acros Organics), and 39.767 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 4,500.

Synthesis Example 6

A mixed solution of 3.00 g of 1,6-bis(2,3-epoxypropan-1-yloxy)naphthalene (trade name HP-4032D, manufactured by DIC Corporation), 3.03 g of diglycidyl terephthalate (trade name EX-711, manufactured by Nagase ChemteX Corporation), 4.37 g of 6-hydroxy-2-naphthoic acid (manufactured by Tokyo Chemical Industry Co., Ltd.), 0.392 g of ethyl triphenylphosphonium bromide (manufactured by Acros Organics), and 25.193 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 5,100.

Synthesis Example 7

A mixed solution of 4.500 g of 1,6-bis(2,3-epoxypropan-1-yloxy)naphthalene (trade name HP-4032D, manufactured by DIC Corporation), 4.548 g of diglycidyl terephthalate (trade name EX-711, manufactured by Nagase ChemteX Corporation), 7.156 g of 6-hydroxy-2-naphthoic acid (manufactured by Tokyo Chemical Industry Co., Ltd.), 0.58 g of ethyl triphenylphosphonium bromide (manufactured by Acros Organics), and 39.181 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 3,800.

Synthesis Example 8

A mixed solution of 5.0 g of 1,6-bis(2,3-epoxypropan-1-yloxy)naphthalene (trade name HP-4032D, manufactured by DIC Corporation), 4.943 g of diglycidyl terephthalate (trade name EX-711, manufactured by Nagase ChemteX Corporation), 6.771 g of 6-hydroxy-2-naphthoic acid (manufactured by Tokyo Chemical Industry Co., Ltd.), 0.410 g of benzyl triethylammonium chloride (manufactured by Tokyo Chemical Industry Co., Ltd.), and 25.685 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 6,800.

Synthesis Example 9

A mixed solution of 5.0 g of 1,6-bis(2,3-epoxypropan-1-yloxy)naphthalene (trade name HP-4032D, manufactured by DIC Corporation), 4.943 g of diglycidyl terephthalate (trade name EX-711, manufactured by Nagase ChemteX Corporation), 7.786 g of 6-hydroxy-2-naphthoic acid (manufactured by Tokyo Chemical Industry Co., Ltd.), 0.410 g of benzyl triethylammonium chloride (manufactured by Tokyo Chemical Industry Co., Ltd.), and 27.209 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 4,300.

Synthesis Example 10

A mixed solution of 5.0 g of 1,6-bis(2,3-epoxypropan-1-yloxy)naphthalene (trade name HP-4032D, manufactured by DIC Corporation), 4.943 g of diglycidyl terephthalate (trade name EX-711, manufactured by Nagase ChemteX Corporation), 5.755 g of 6-hydroxy-2-naphthoic acid (manufactured by Tokyo Chemical Industry Co., Ltd.), 0.410 g of benzyl triethylammonium chloride (manufactured by Tokyo Chemical Industry Co., Ltd.), and 24.162 g of propylene glycol monomethyl ether was heated to 120° C. and reacted under a nitrogen atmosphere for 24 hours, to obtain a solution of macromolecular compound having structural units of Formulae (A-2) and (A-3). The obtained macromolecular compound was analyzed by GPC. The weight-average molecular weight in terms of standard polystyrene was about 1,200.

Comparative Synthesis Example 1

A mixed solution of 7 g of diglycidyl terephthalate (trade name EX-711, manufactured by Nagase ChemteX Corporation), 5.508 g of 2,6-naphthalene dicarboxylic acid (manufactured by Tokyo Chemical Industry Co., Ltd.), 0.473 g of ethyl triphenylphosphonium bromide (manufactured by Acros Organics), and 30.288 g of propylene glycol monomethyl ether was heated to 120° C. and reacted under a nitrogen atmosphere for 24 hours, to obtain a solution of macromolecular compound having a structural unit of Formula (A-4). The obtained macromolecular compound was analyzed by GPC. The weight-average molecular weight in terms of standard polystyrene was about 152,900.

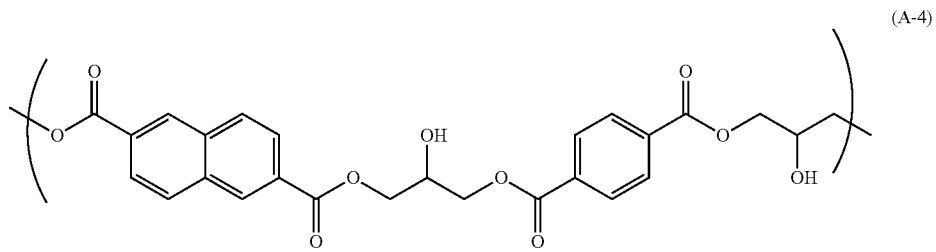

(A-4)

Comparative Synthesis Example 2

A mixed solution of 7 g of diglycidyl terephthalate (trade name EX-711, manufactured by Nagase ChemteX Corporation), 4.081 g of 2,6-dihydroxynaphthalene (manufactured by Tokyo Chemical Industry Co., Ltd.), 0.473 g of ethyl triphenylphosphonium bromide (manufactured by Acros Organics), and 26.958 g of propylene glycol monomethyl ether was heated to 120° C. and reacted under a nitrogen atmosphere for 24 hours, to obtain a solution of macromolecular compound having a structural unit of Formula (A-5). The obtained macromolecular compound was analyzed by GPC. The weight-average molecular weight in terms of standard polystyrene was about 1,100.

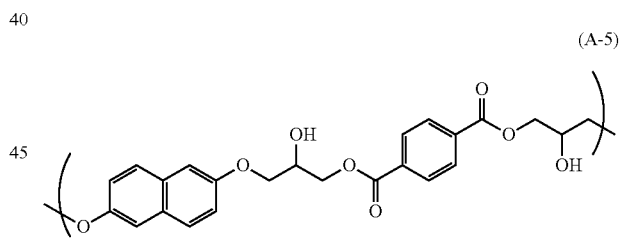

(A-5)

Comparative Synthesis Example 3

A mixed solution of 4.0 g of 1,6-bis(2,3-epoxypropan-1-yloxy)naphthalene (trade name HP-4032D, manufactured by DIC Corporation), 4.199 g of diglycidyl terephthalate (trade name EX-711, manufactured by Nagase ChemteX Corporation), 6.223 g of 2,6-naphthalene dicarboxylic acid (manufactured by Tokyo Chemical Industry Co., Ltd.), 0.534 g of ethyl triphenylphosphonium bromide (manufactured by Acros Organics), and 34.898 g of propylene glycol monomethyl ether was heated to 120° C. and reacted under a nitrogen atmosphere for 24 hours, to obtain a solution of macromolecular compound having structural units of Formulae (A-6) and (A-7). The obtained macromolecular compound was analyzed by GPC. The weight-average molecular weight in terms of standard polystyrene was about 136,200.

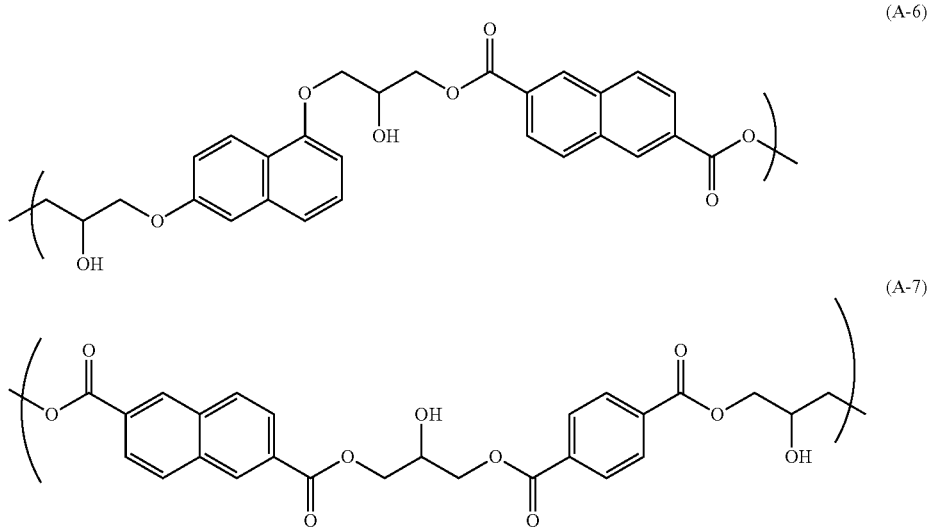

(A-6)

(A-7)

Comparative Synthesis Example 4

A mixed solution of 4.0 g of 1,6-bis(2,3-epoxypropan-1-yloxy)naphthalene (trade name HP-4032D, manufactured by DIC Corporation), 4.199 g of diglycidyl terephthalate (trade name EX-711, manufactured by Nagase ChemteX Corporation), 4.610 g of 2,6-dihydroxynaphthalene (manufactured by Tokyo Chemical Industry Co., Ltd.), 0.534 g of ethyl triphenylphosphonium bromide (manufactured by Acros Organics), and 31.135 g of propylene glycol monomethyl ether was heated to 120° C. and reacted under a nitrogen atmosphere for 24 hours, to obtain a solution of macromolecular compound having structural units of Formulae (A-8) and (A-9). The obtained macromolecular compound was analyzed by GPC. The weight-average molecular weight in terms of standard polystyrene was about 1,800.

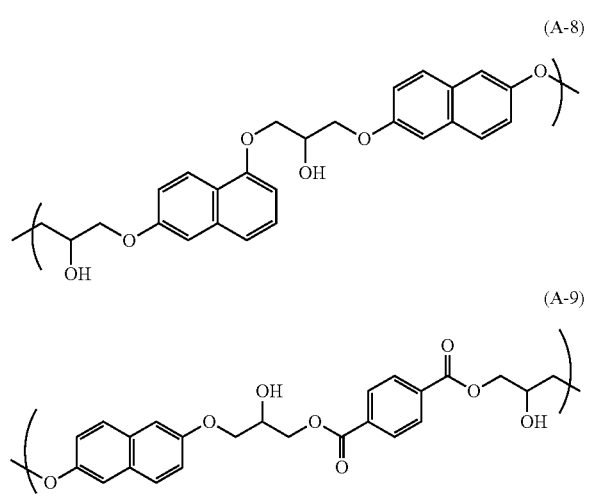

(A-8)

(A-9)

(Solubility in Solvent)

Solubility of the polymers obtained in Synthesis Examples 1 to 7 and Comparative Synthesis Examples 1 to 4 in propylene glycol monomethyl ether (hereinafter abbreviated as PGME in the present specification) are shown in Tables 1 and 2. In Tables, "○" represents that the polymer is completely dissolved in PGME, and "X" represents that a rubbery insoluble substance or a gel-like insoluble substance remains in PGME.

TABLE 1

| | Solubility in PGME | Weight-average molecular weight |
|---|---|---|
| Synthesis Example 1 | ○ | 3,900 |
| Synthesis Example 2 | ○ | 3,900 |
| Comparative Synthesis Example 1 | X (rubbery insoluble substance) | 152,900 |
| Comparative Synthesis Example 2 | X (gel-like insoluble substance) | 1,100 |

TABLE 2

| | Solubility in PGME | Weight-average molecular weight |
|---|---|---|
| Synthesis Example 3 | ○ | 6,100 |
| Synthesis Example 4 | ○ | 5,900 |
| Synthesis Example 5 | ○ | 4,500 |
| Synthesis Example 6 | ○ | 5,100 |
| Synthesis Example 7 | ○ | 3,800 |
| Synthesis Example 8 | ○ | 6,800 |
| Synthesis Example 9 | ○ | 4,300 |
| Synthesis Example 10 | ○ | 1,200 |
| Comparative Synthesis Example 3 | X (rubbery insoluble substance) | 136,200 |
| Comparative Synthesis Example 4 | X (gel-like insoluble substance) | 1,800 |

As shown from the results in Tables 1 and 2, a polymer having good solubility in PGME as a solvent that is suitably used for the resist underlayer film-forming composition is obtained using hydroxy naphthoic acid having a carboxyl group and a hydroxyl group at the 2-position and the 6-position, respectively, of a naphthalene ring as a compound having an aromatic ring to be reacted with a glycidyl ether compound and/or a glycidyl ester compound. In contrast, a polymer obtained using naphthalene diol or naphthalene dicarboxylic acid having hydroxyl groups or carboxyl groups at both the 2- and 6-positions of a naphthalene ring instead of the naphthalen compound has low solubility in PGME.

Example 1

To 10 g of the solution containing 2 g of the macromolecular compound obtained in Synthesis Example 1 (using PGME used for synthesis as a solvent), 0.5 g of tetramethoxymethyl glycoluril [POWDERLINK (registered trademark) 1174, Nihon Cytec Industries Inc.], 0.08 g of 5-sulfosalicylic acid dihydrate, 0.10 g of TAG-2689 (manufactured by King Industries, Inc.), 0.02 g of R-30N (manufactured by DIC Corporation), 95.11 g of PGME, and 44.19 g of propylene glycol monomethyl ether acetate were added to obtain a solution. Then, a resist underlayer film-forming composition was prepared by filtering the solution through a microfilter made of polyethylene with a pore diameter of 0.02 μm.

Example 2

To 10 g of the solution containing 2 g of the macromolecular compound obtained in Synthesis Example 3 (using PGME used for synthesis as a solvent), 0.5 g of tetramethoxymethyl glycoluril [POWDERLINK (registered trademark) 1174, Nihon Cytec Industries Inc.], 0.10 g of 5-sulfosalicylic acid dihydrate, 0.02 g of R-30N (manufactured by DIC Corporation), 92.05 g of PGME, and 42.88 g of propylene glycol monomethyl ether acetate were added to obtain a solution. Then, a resist underlayer film-forming composition was prepared by filtering the solution through a microfilter made of polyethylene with a pore diameter of 0.02 μm.

Example 3

To 10 g of the solution containing 2 g of the macromolecular compound obtained in Synthesis Example 7 (using PGME used for synthesis as a solvent), 0.4 g of tetramethoxymethyl glycoluril [POWDERLINK (registered trademark) 1174, Nihon Cytec Industries Inc.], 0.05 g of 5-sulfosalicylic acid dihydrate, 0.08 g of R-40-LM (manufactured by DIC Corporation) (20% by mass propylene glycol monomethyl ether acetate solution), 76.58 g of PGME, and 36.19 g of propylene glycol monomethyl ether acetate were added to obtain a solution. Then, a resist underlayer film-forming composition was prepared by filtering the solution through a microfilter made of polyethylene with a pore diameter of 0.02 μm.

Example 4

To 10 g of the solution containing 2 g of the macromolecular compound obtained in Synthesis Example 8 (using PGME used for synthesis as a solvent), 0.5 g of tetramethoxymethyl glycoluril [POWDERLINK (registered trademark) 1174, Nihon Cytec Industries Inc.], 0.10 g of 5-sulfosalicylic acid dihydrate, 0.02 g of R-30N (manufactured by DIC Corporation), 92.05 g of PGME, and 42.88 g of propylene glycol monomethyl ether acetate were added to obtain a solution. Then, a resist underlayer film-forming composition was prepared by filtering the solution through a microfilter made of polyethylene with a pore diameter of 0.02 μm.

(Elution Test into Photoresist Solvent)

Each resist underlayer film-forming composition prepared in Examples 1 to 4 was applied to a silicon wafer using a spinner. The silicon wafer was heated on a hot plate at 205° C. for 1 minute to form a resist underlayer film. The resist underlayer film was immersed in OK73 thinner (manufactured by TOKYO OHKA KOGYO CO., LTD., mixed solution of propylene glycol monomethyl ether and propylene glycol monomethyl ether acetate) as a solvent used in application of photoresist for 1 minute. A change in thickness of the resist underlayer film before and after the immersion was confirmed to be 1 nm or less.

(Elution Test into Resist Developer)

Each resist underlayer film-forming composition prepared in Examples 1 to 4 was applied to a silicon wafer using a spinner. The silicon wafer was heated on a hot plate at 205° C. for 1 minute to form a resist underlayer film. The resist underlayer film was immersed in NMD-3 (manufactured by TOKYO OHKA KOGYO CO., LTD.) as a developer used in photoresist development for 1 minute. A change in thickness of the resist underlayer film before and after the immersion was confirmed to be 1 nm or less.

(Test of Optical Parameter)

Each resist underlayer film-forming composition prepared in Examples 1 to 4 was applied to a silicon wafer using a spinner. The silicon wafer was heated on a hot plate at 205° C. for 1 minute to form a resist underlayer film (thickness: 0.05 μm). The refractive index (n value) and the extinction coefficient (k value) of the resist underlayer film were measured at a wavelength of 248 nm using a spectroscopic ellipsometer (VUVVASE VU-302, manufactured by J. A. Woollam Co., Inc.). The results are shown in Table 3. The refractive index (n value) and the extinction coefficient (k value) were measured at a wavelength of 193 nm in the same manner. The results are shown in Table 4. As shown from the results in Tables 3 and 4, the resist underlayer film formed from the resist underlayer film-forming composition in each of Examples 1 to 4 has properties sufficient to prevent reflection on a resist during exposure.

TABLE 3

| | Refractive index (n) | Extinction coefficient (k) |
|---|---|---|
| Example 1 | 1.77 | 0.49 |
| Example 2 | 1.81 | 0.55 |
| Example 3 | 1.82 | 0.57 |
| Example 4 | 1.83 | 0.56 |

TABLE 4

| | Refractive index (n) | Extinction coefficient (k) |
|---|---|---|
| Example 1 | 1.55 | 0.37 |
| Example 2 | 1.52 | 0.28 |
| Example 3 | 1.51 | 0.30 |
| Example 4 | 1.52 | 0.29 |

(Measurement of Dry Etching Rate)

Each resist underlayer film-forming composition prepared in Examples 1 to 4 was applied to a silicon wafer using a spinner. The silicon wafer was heated on a hot plate at 205° C. for 1 minute to form a resist underlayer film. The dry etching rate was measured with a RIE device (RIE-10NR, manufactured by SAMCO INC.) using $CF_4$ gas as a dry etching gas. A photoresist solution SEPR-430 (manufactured by Shin-Etsu Chemical Co., Ltd.) was similarly applied to a silicon wafer using a spinner, and the silicon wafer was heated to form a photoresist film. The dry etching rate was measured with a RIE device (RIE-10NR, manufactured by SAMCO INC.) using $CF_4$ gas as a dry etching gas. The dry etching rate of the resist underlayer film formed from the resist underlayer film-forming composition in each of Examples 1 to 4 was compared with that of the photoresist film. Table 5 shows a selection ratio of the dry etching rate of the resist underlayer film formed from the resist underlayer film-forming composition in each of Examples 1 to 4 to that of the photoresist film.

TABLE 5

|  | Selection ratio |
| --- | --- |
| Example 1 | 1.3 |
| Example 2 | 1.1 |
| Example 3 | 1.1 |
| Example 4 | 1.1 |

As shown in Table 5, the dry etching rate of the resist underlayer film formed from the resist underlayer film-forming composition in each of Examples 1 to 4 is higher than that of the resist film formed on the upper layer of the resist underlayer film. Therefore, the resist underlayer film-forming composition can be suitably used in a lithography process.

The invention claimed is:

1. A resist underlayer film-forming composition, comprising:
a polymer having a structural unit of Formula (1a) or Formula (1c) arranged alternately with a structural unit of Formula (1b):

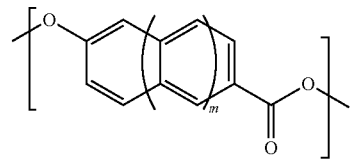

(1a)

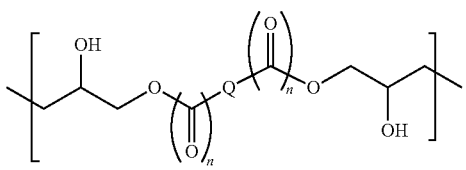

(1b)

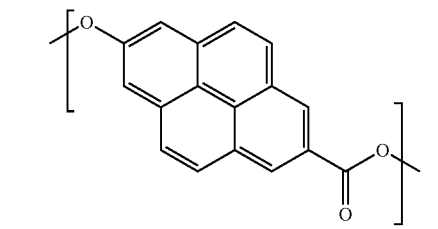

(1c)

where:
Q is a phenylene group or a naphthylene group,
m is 1 or 2, and
each n is independently 0 or 1; and
a solvent containing more than 50% by mass of propylene glycol monomethyl ether.

2. The resist underlayer film-forming composition according to claim 1, wherein the polymer has a structural unit of Formula (1a') as the structural unit of Formula (1a), a structural unit of Formula (1b') and a structural unit of Formula (1b") as the structural unit of Formula (1b), and in the polymer, the structural unit of Formula (1a') and the structural unit of Formula (1b'), and the structural unit of Formula (1a') and the structural unit of Formula (1b") are arranged alternately:

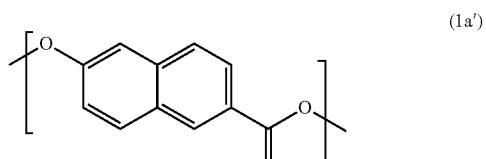

(1a')

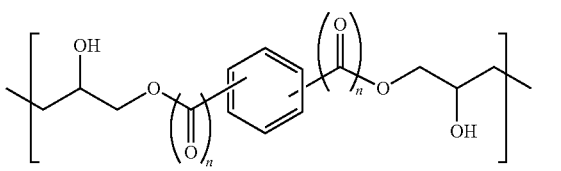

(1b')

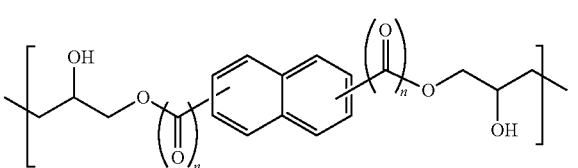

(1b")

where n is as defined in claim 1.

3. The resist underlayer film-forming composition according to claim 1, wherein when the solvent contains less than 100% by mass of the propylene glycol monomethyl ether, a residual component of the solvent is a solvent miscible in propylene glycol monomethyl ether without layer separation.

4. The resist underlayer film-forming composition according to claim 1, further comprising a crosslinkable compound.

5. The resist underlayer film-forming composition according to claim 4, further comprising a crosslinking catalyst.

6. The resist underlayer film-forming composition according to claim 1, further comprising a surfactant.

* * * * *